United States Patent [19]

Moreau et al.

[11] Patent Number: 4,878,026

[45] Date of Patent: Oct. 31, 1989

[54] MEASURING CIRCUIT OF THE DC COMPONENT OF THE CURRENT FLOWING THROUGH THE PRIMARY WINDING OF THE OUTPUT TRANSFORMER OF AN INVERTER

[75] Inventors: Philippe Moreau, Gieres; Jean-Noël Fiorina, Grenoble, both of France

[73] Assignee: Merlin Gerin, France

[21] Appl. No.: 137,938

[22] Filed: Dec. 28, 1987

[30] Foreign Application Priority Data

Jan. 9, 1987 [FR] France ................................ 87 00243

[51] Int. Cl.$^4$ ............................................ G01R 31/06
[52] U.S. Cl. .................................... 324/547; 324/522; 324/102; 324/141; 363/97
[58] Field of Search ............... 324/547, 546, 141, 142, 324/55, 59, 522, 102; 363/16, 97, 98, 131

[56] References Cited

U.S. PATENT DOCUMENTS

| | | | |
|---|---|---|---|
| 3,193,803 | 7/1965 | Hoffman | 324/60 CD |
| 3,657,631 | 4/1972 | Martens et al. | |
| 4,459,546 | 7/1984 | Arrington et al. | 324/142 |
| 4,556,842 | 12/1985 | Rosswurm | 324/102 |
| 4,608,533 | 8/1986 | Starkie | 324/142 |

FOREIGN PATENT DOCUMENTS 3040753 5/1985 Fed. Rep. of Germany .
2143958 2/1985 United Kingdom .

*Primary Examiner*—Reinhard J. Eisenzopf
*Assistant Examiner*—Robert W. Mueller
*Attorney, Agent, or Firm*—Arnold, White & Durkee

[57] ABSTRACT

The measuring circuit comprises an integrator to which a signal representative of the current flowing through the primary winding of the output transformer of an inverter is applied. The integrator output signal is reset at the beginning of each period of the A.C. component of said current and is applied to a sample and hold stage whose output signal represents the integrator output signal just before it is reset. An intermediate stage is arranged between the integrator and the sample and hold stage to reduce the influence of load impacts by limiting the maximum possible variation of the output signal during the sampling period.

5 Claims, 5 Drawing Sheets

MEASURING CIRCUIT OF THE DC COMPONENT OF THE CURRENT FLOWING THROUGH THE PRIMARY WINDING OF THE OUTPUT TRANSFORMER OF AN INVERTER

BACKGROUND OF THE INVENTION

The invention relates to a measuring circuit of the D.C. component of the current flowing through the primary winding of the output transformer of an inverter.

In power converter inverters, the existence of interference D.C. currents in the primary winding of the inverter output transformer gives rise to transformer saturation problems.

Up to now, the use of transformers comprising an air gap, and consequently able to withstand the flow of a D.C. component, enabled this problem to be overlooked. The increasingly frequent use of transformers without an air gap however makes this problem a more and more crucial one. It is therefore desirable to eliminate this D.C. component, and to accomplish this, it is necessary to have a measurement of it which can be used by the inverter control circuit to automatically reduce this component to zero.

As the A.C. component, at mains frequency, has a large amplitude in comparison with the D.C. component, the use of RC filters would lead to a considerable phase displacement which would unbalance the feedback loop designed to achieve automatic control.

SUMMARY OF THE INVENTION

The object of the invention is to achieve a measuring circuit which is both simple and efficient, which does not cause any phase displacement and provides a suitable answer to the problem which arises.

The measuring circuit according to the invention is characterized in that it comprises a detection device producing a signal representative of the current flowing through the winding, an integrator designed to integrate the signal detected on a period of the A.C. component of the current, the integrator output signal being reset at the beginning of each of said periods and being applied to a sample and hold stage designed to sample it just before it is reset, in such a way as to supply on output a signal representative of the mean amplitude of the D.C. component present during the previous period.

This circuit, although it operates correctly when the transformer load is constant or varies slowly, does not provide a correct measurement of the D.C. component if sudden load modifications occur.

To solve this second problem, in the preferred embodiment of the invention, the integrator output signal is applied to the sample and hold stage via an intermediate stage comprising an operational amplifier whose positive input is grounded and whose negative input is connected to the integrator output by a first resistor and to the sample and hold stage input by a second resistor, a third resistor being arranged between the operational amplifier output and the sample and hold stage input, in such a way as to limit the maximum possible variation of the measuring circuit output signal during the sampling period.

BRIEF DESCRIPTION OF THE DRAWINGS

Other advantages and features will become more clearly apparent from the following description of several illustrative embodiments of the invention, given as non-restrictive examples only and represented in the accompanying drawings, in which.

According to the invention, in order to eliminate the A.C. component of the input signal V1 and to obtain a signal proportional to the D.C. component of this signal at the integrator output, integration takes place on a period T of the A.C. component. The integrator is reset by means of a normally open switch 12, fitted in parallel with the capacitor C1, which is closed for a short time at the beginning of each period. In a preferred embodiment, the switch, which can be constituted by any semiconductor switch, is controlled by a signal K1 obtained from a signal representative of the A.C. current passing zero. If the measuring circuit is used in an inverter, a periodic signal of this kind is already available.

Figure 2:
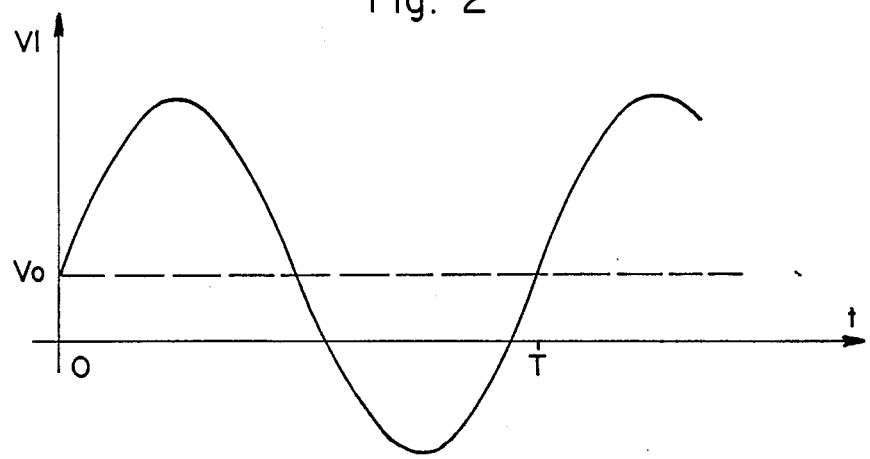
FIG. 2 represents the wave shapes of the signals V1, V2 and V3 present in the circuit according to FIG. 1.
Figure 2:
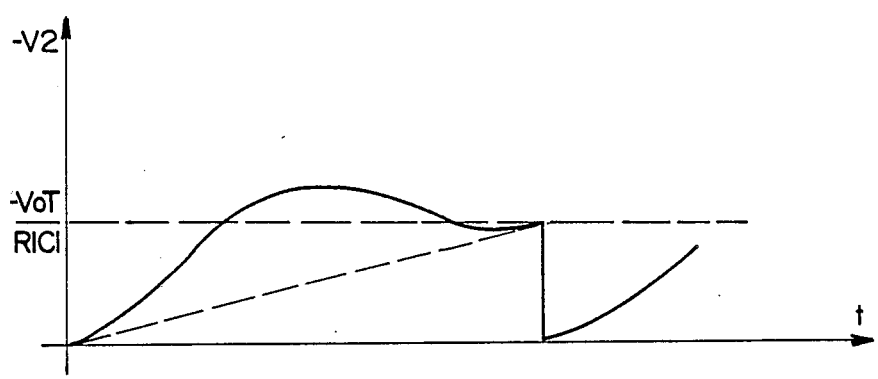
Figure 2:
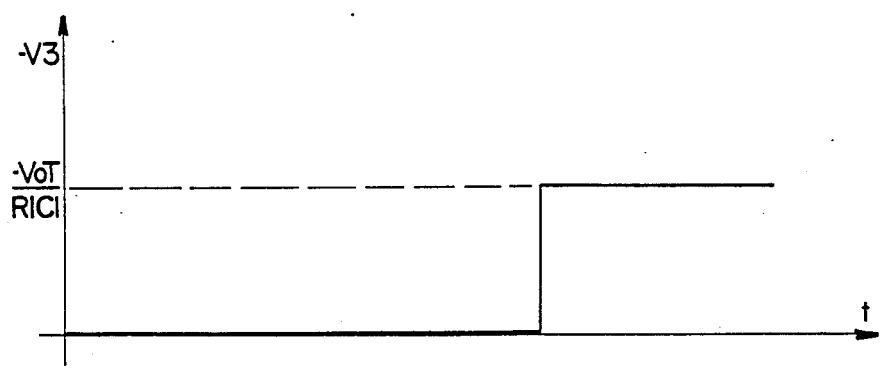

The wave shapes of the signals V1 and V2 are represented in FIG. 2. For a signal V1 of shape $V1 = Vo + v$, Vo being the D.C. component and v the A.C. component, we obtain at the end of a time T corresponding to a period of the A.C. component v a signal:

$$V2 = -\frac{1}{R1C1} \int_O^T V1\,dt = -\frac{Vo}{R1C1} \cdot T \text{ for } Vo = \text{constant}$$

V2 being reset at the times 0, T, 2T . . .

In practice, the signal V1 comprises not only the D.C. component Vo and the sinusoidal component v, but also harmonics of the latter. For a signal v at mains frequency (50 Hz), this essentially involves 2 kHz frequency harmonics which are practically cancelled out in the course of integration over the period T (20 ms for a 50 Hz mains frequency). The maximum error corresponds to a half-wave of the harmonic, has a very small amplitude and can be ignored.

The integrator output signal is applied to a sample and hold stage. The latter is constituted by an operational amplifier 14 mounted as a follower stage, whose positive input is connected by a switch 16 to the integrator output and by a capacitor C2 to the ground, and whose negative input is connected to the output. The switch 16, which is normally open, is formed by any type of semi-conductor switch and is controlled by a signal K2 which closes it for a short time, just before the integrator is reset, that is to say just before the switch 12 is closed by the signal K1.

As an example, for a mains frequency of 50 Hz, and therefore a period T of 20 ms, the duration of each of the reset K1 and sampling K2 signals is approximately 150 μs.

During the time the switch 16 is closed, or sampling time, the integrator output signal V2 is therefore applied to the capacitor C2 which keeps the information until the next closing of the switch, i.e. for a period T. As shown in FIG. 2, the sample and hold stage output signal V3 is therefore representative of the mean amplitude value of the input signal D.C. component Vo during the previous period.

In the envisaged application, i.e. measuring the direct current flowing through the primary winding of the output transformer of an inverter, this difference between the actual instantaneous value and the measured value does not cause any problem, as the transformer saturation time constant is very great in comparison with the period T over which the integration and sampling are performed.

Figure 1:
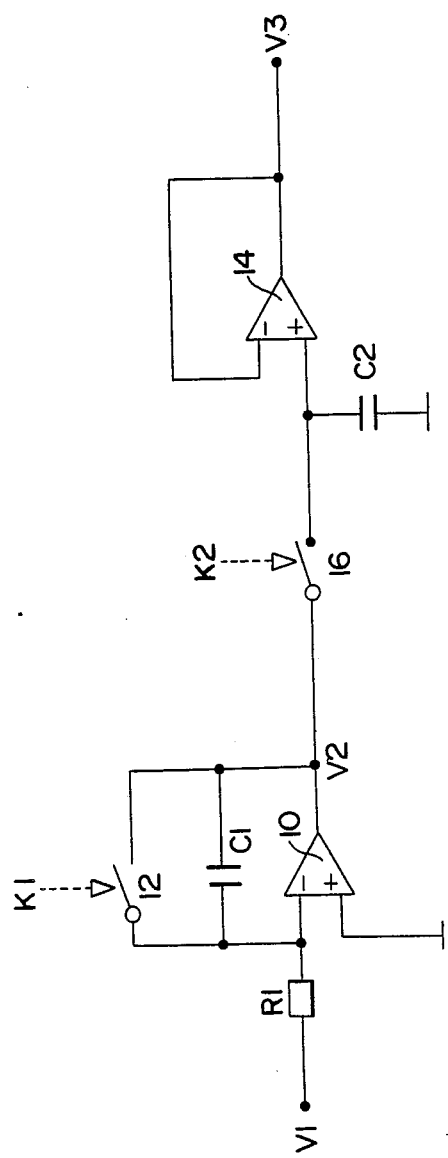
FIG. 1 represents, in diagram form, a measuring circuit according to a first embodiment of the invention.

The measuring circuit in FIG. 1, although it operates correctly when the transformer load is constant or varies slowly, does not provide a solution to the problem posed when sudden transformer load modifications occur, for instance when loading takes place.

Figure 3:
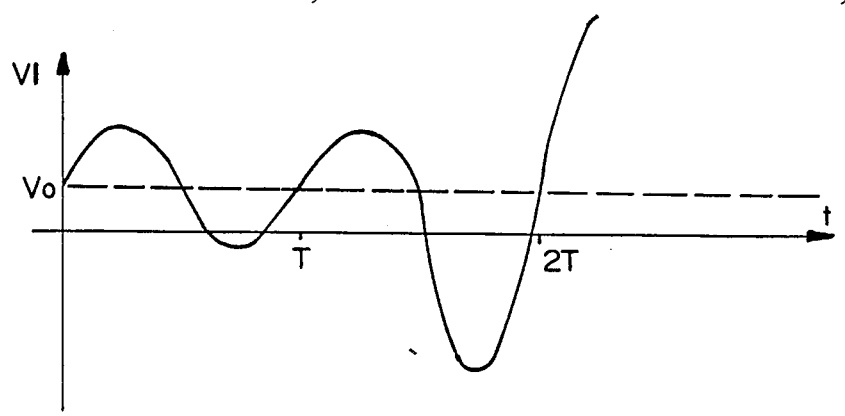
FIG. 3 represents the wave shapes of the same signals obtained with the circuit according to FIG. 1, in the case of a load impact.
Figure 3:
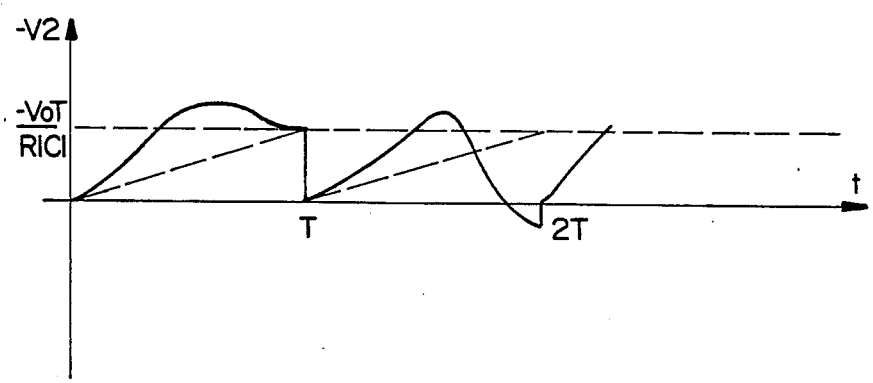
Figure 3:
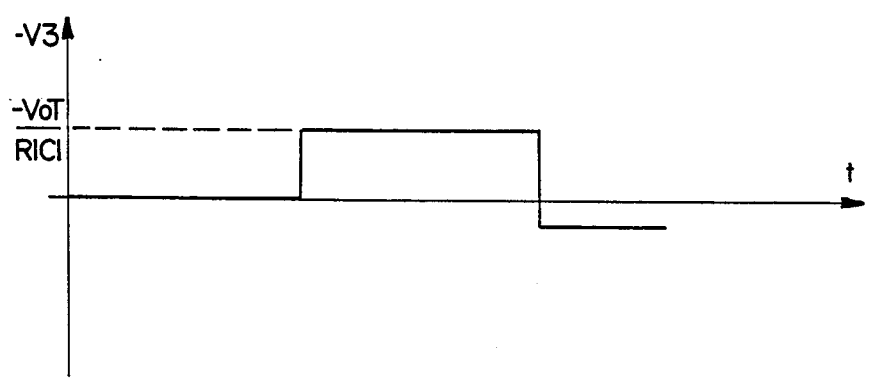

The influence of a load impact is illustrated in FIG. 3, in which the D.C. component Vo has been assumed to be constant.

The value of the signal V3 at the time 2T does not correspond to a modification of the interference D.C. component, but to a sudden variation in the amplitude of the A.C. component during the integration period, between T and 2T in the figure. If this load impact is interpreted as a sudden modification of the D.C. component and the value V3 obtained used to regulate this D.C. component, this inevitably leads to disturbance of the system.

It is therefore desirable to eliminate any information which may be considered to be erroneous. As has already been emphasized above, the saturation time constant of a transformer is very great in comparison with the D.C. component measuring period T, so that eliminating information for one period does not give rise to any problem in practice. A threshold could be fixed above which a measurement is considered to be erroneous. But this threshold, which would have to be high in some applications where the D.C. component may be great, is difficult to set. The present invention therefore provides another solution to this problem.

Figure 4:
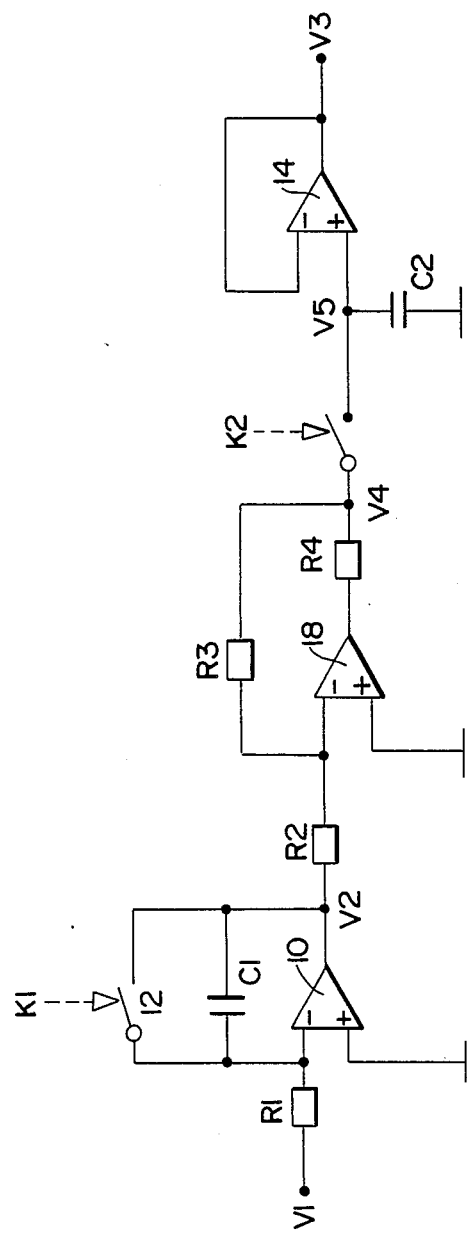
FIG. 4 also represents, in diagram form, a measuring circuit according to a second embodiment of the invention.

In the preferred embodiment illustrated in FIG. 4, in which the same parts as those of the measuring circuit according to FIG. 1 are designated by the same references, an intermediate stage is fitted between the integrator and sample and hold stages, limiting the possible variations of the voltage applied to the sample and hold stage between two periods. This intermediate stage is formed by an operational amplifier 18 whose positive input is grounded and whose negative input is connected both to the integrator output by a resistor R2 and to the sample and hold stage input by a resistor R3. The output of the operational amplifier 18 is, for its part, connected to the sample and hold stage input by a resistor R4, which results in the output impedance of the operational amplifier 18 being artificially increased.

When the switch 16 closes, the intermediate stage output voltage V4 takes the value of the voltage V5 existing at the terminals of the sample and hold stage capacitor C2, this voltage V5 not being able to vary instantaneously. For resistors R2 and R3 of the same value, i.e. an intermediate stage with a gain equal to one, when the output voltage V4 is different from the input voltage V2, the operational amplifier 18 is in a state of saturation and the capacitor C2 charges or discharges via the resistor R4, with a time constant R4C2, the voltage V5 at the capacitor terminals tending to the saturation voltage ± Vsat of the amplifier 18. The time constant R4C2 is chosen in such a way as to be great in comparison with the closing time Δ TK2 (approximately 150 μs) of the switch 16. During this time the voltage V5 can only increase or decrease by a preset value $$\Delta V\mathrm{max} = V\mathrm{sat} \cdot \frac{\Delta TK2}{R4C2}$$

Figure 5:
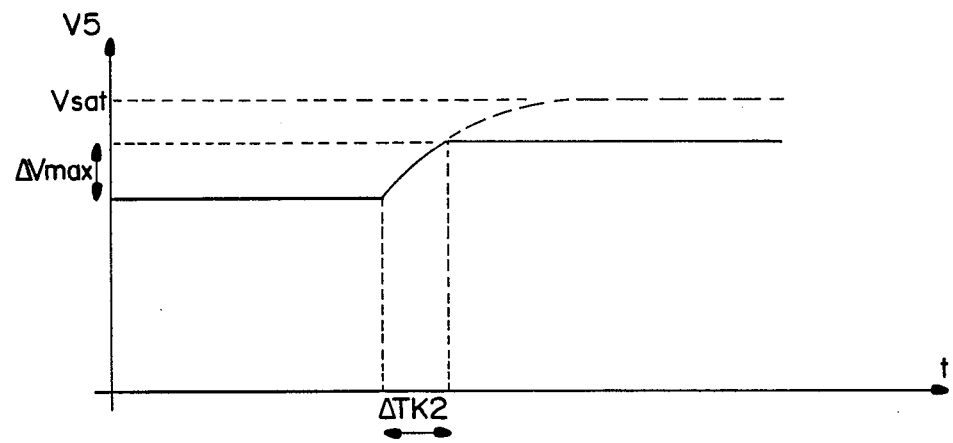
FIG. 5 represents the wave shape of the signal V5 present in the circuit in FIG. 4.

Thus, during the sampling period during which the switch 16 is closed, when the voltages V5 and V4 reach the value of V2, that is to say when the voltage variation required by the integrator in comparison with the previous period is less than Δ Vmax, the operational amplifier is no longer saturated and the intermediate stage no longer plays any role. If, on the other hand, the voltage variation required by the integrator is greater than the maximum value Δ Vmax, the effective voltage variation of the signal V5 is limited to this maximum value, as represented in FIG. 5

As an example, if the maximum presumed deviation of the D.C. component is 150 mV, the values R4 and C2 are chosen in such a way that the maximum variation of the voltage V5, and therefore of the voltage V3, from one period to another is limited to 40 mV. This therefore implies that the measuring circuit will require 4 periods to take account of a maximum deviation of this order. This does not give rise to any problems in practice, for such a variation normally takes place slowly. If, however, a load impact occurs, the increase of the voltage V5, and therefore of the voltage V3, will be limited to 40 mV, the measured value being restabilized as soon as the load is stabilized, thus limiting the influence of the erroneous measurement. This deviation of the measured value in comparison with the actual value of the D.C. component, limited to 40 mV, will not be critical for regulation of the D.C. component. Its influence will in fact be practically nil, on average, over a duration ranging from 100 ms to 1 s.

It is quite clear that the intermediate stage does not necessarily have a gain equal to one, the ratio of the resistors R2 and R3 then having to be taken into account to determine the maximum variation permitted.

Figure 6:
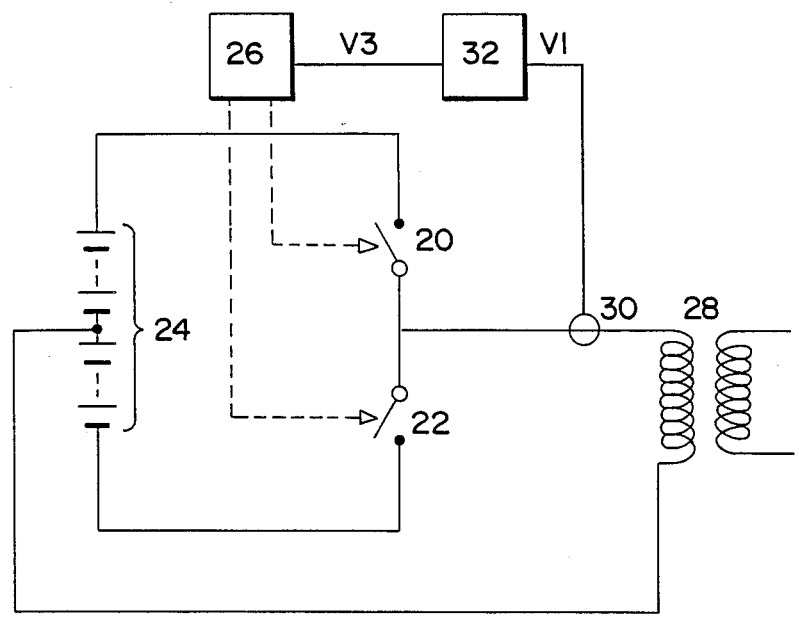
FIG. 6 is a representation, in very diagrammatic form, of an inverter comprising a measuring circuit according to the invention. DESCRIPTION OF THE PREFERRED EMBODIMENT The measuring circuit represented in FIG. 1 comprises a first operational amplifier 10 designed to integrate the input signal constituted by voltage V1 representative of a current comprising a sinusoidal A.C. component v and a D.C. component Vo. The voltage V1 is therefore applied via a resistor R1 to the negative input of the operational amplifier 10, the positive input of which is earthed. The negative input of the amplifier is connected to the output by a capacitor C1. The amplifier thus constitutes an integrator, the output voltage V2 being given by $$V2 = -\frac{1}{R1C1} \int V1\,dt$$

FIG. 6 illustrates in diagra form an inverter comprising a measuring circuit according to the invention. In the embodiment represented as an example, this involves an inverter of the type comprising two switches controlled in series and a source with a mid-point. The two controlled switches 20, 22, are arranged in series on the terminals of the direct voltage source 24, the switches being controlled alternately by a control circuit 26. In a manner well known in the art, these switches are bidirectional current switches achieved using a component connected anti-parallel with a diode, this component being constituted for example by a thyristor, a bipolar transistor, a MOS transistor, etc. The primary winding of an output transformer 28 is connected between the common point of the two switches and the mid-point of the source 24.

The structure and operation of an inverter of this type are well known in the art and will not be described in greater detail here. As has already been mentioned, saturation problems arise when a current including a D.C. component flows through the primary winding of the output transformer, especially in the case where the transformer used does not comprise an air gap.

The invention enables the D.C. component of the current flowing through the transformer primary winding to be measured. The current, made up by the superposition of an A.C. component and a D.C. component, is detected by means of a sensor 30, which is for example a Hall effect sensor, supplying a voltage signal (V1) representative of the current which is applied to a measuring circuit 32 of the type represented in FIG. 4. The output signal V3 of the measuring circuit 32 is applied to the control circuit 26 which consequently modifies the closing times of the switches, in such a way as to tend to eliminate the D.C. component of the current flowing through the transformer. Thus, when a positive D.C. component is measured, the control circuit 26 will modify the respective closing times of the switches 20 and 22, so that the switch 20, connected to the positive terminal of the battery 24 is conducting for a shorter time. The means required to implement such an automatic control are well known in the art and will therefore not be described in greater detail.

It is quite obvious that the measuring circuit according to the invention can be used not only for the output transformer of an inverter of the type represented in FIG. 6, but for any type of inverter, whether it be an assembly with two switches, in series or in parallel with a mid-point transformer, or a bridge assembly with four switches, and whether the inverter be single-phase or three-phase. In the latter case, only two measuring circuits according to the invention are used to control two of the phases, the third phase then being automatically controlled of its own accord.

We claim:

1. A measuring circuit of the D.C. component of the current flowing through the primary winding of the output transformer of an inverter, comprising a detection device producing a signal representative of the current flowing through said winding, an integrator designed to integrate said signal detected on a period of the A.C. component of the current, the integrator output signal being reset at the beginning of each of said periods and being applied to a sample and hold stage designed to sample it just before it is reset, in such a way as to supply on output a signal representative of the mean amplitude of the D.C. component present during the previous period and wherein the integrator output signal is applied to the sample and hold stage via an intermediate stage comprising a first operational amplifier whose positive input is grounded and whose negative input is connected to the integrator output by a first resistor and to the sample and hold stage input by a second resistor, a third resistor being arranged between the output of the first operational amplifier and the sample and hold stage input, in such a way as to limit the maximum possible variation of the measuring circuit output signal during the sampling period.

2. The circuit according to claim 1, wherein the integrator is constituted by a second operational amplifier whose positive input is earthed and whose negative input is connected to the output by a first capacitor, a first normally open switch being fitted in parallel on the first capacitor and being closed for a short time, under the control of a signal, at the beginning of each period of the A.C. component of the current, so as to reset the integrator, the signal representative of the current flowing through the inverter output transformer being constituted by a voltage and applied to the negative input of the second operational amplifier via a fourth resistor.

3. The circuit according to claim 2, wherein the control signal of the first switch is obtained from a signal representative of the A.C. component of the current passing zero.

4. The circuit according to claim 1, wherein the sample and hold stage is constituted by a third operational amplifier whose negative input is connected to the output and whose positive input is connected via a second capacitor to the ground and via a second normally open switch to the sample and hold stage input, the second switch being closed for a short time, under the control of a signal, just before the integrator is reset.

5. The circuit according to claim 4, wherein the control signal of the second switch is obtained from a signal representative of the A.C. component of the current passing zero.

* * * * *